(12) United States Patent
Chen et al.

(10) Patent No.: US 11,030,948 B2
(45) Date of Patent: Jun. 8, 2021

(54) DISPLAY PANEL

(71) Applicant: Au Optronics Corporation, Hsinchu (TW)

(72) Inventors: Yung-Chih Chen, Taichung (TW); Wan-Lin Chen, Hsinchu (TW); Tsung-Ying Ke, Tainan (TW); Li-Chih Hsu, Taipei (TW); Ya-Ting Hsu, Hsinchu (TW); Keh-Long Hwu, Hsinchu County (TW); Wan-Tsang Wang, Hsinchu (TW); Chun-Hsin Liu, Yunlin County (TW); Chih-Ling Hsueh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/421,431

(22) Filed: May 23, 2019

(65) Prior Publication Data

US 2020/0193900 A1 Jun. 18, 2020

(30) Foreign Application Priority Data

Dec. 13, 2018 (TW) ................................ 107145079

(51) Int. Cl.
*G09G 3/3225* (2016.01)
*H05K 1/11* (2006.01)
*H05K 5/00* (2006.01)

(52) U.S. Cl.
CPC ........... *G09G 3/3225* (2013.01); *H05K 1/115* (2013.01); *H05K 5/0017* (2013.01); *G09G 2300/0439* (2013.01); *G09G 2310/0264* (2013.01)

(58) Field of Classification Search
CPC ......... G09G 3/3225; G09G 2300/0439; G09G 2310/0264; H05K 1/115; H05K 5/0017
See application file for complete search history.

(56) References Cited

U.S. PATENT DOCUMENTS

| 7,675,479 B2 | 3/2010 | Jung |
| 8,022,922 B2 | 9/2011 | Kang |
(Continued)

FOREIGN PATENT DOCUMENTS

| CN | 1804996 | 7/2006 |
| CN | 1955793 | 5/2007 |
(Continued)

*Primary Examiner* — Peter D McLoone
(74) *Attorney, Agent, or Firm* — JCIPRNET (57) ABSTRACT

The disclosure provides a display panel including first pixel structures, second pixel structures, first signal lines, second signal lines, a first driving circuit, and a second driving circuit. The first signal lines and the first pixel structures are disposed in a first display area and electrically connected. The second signal lines and the second pixel structures are disposed in a second display area and electrically connected. The first display area and the second display area are arranged in a first direction. The first signal lines and the second signal lines are arranged in a second direction. The first direction and the second direction are perpendicular. The first signal lines and the second signal lines are structurally separated. The first drive circuit is electrically connected to the first signal lines. The second driving circuit is electrically independent from the first driving circuit and electrically connected to the second signal lines.

9 Claims, 7 Drawing Sheets

(56) References Cited

U.S. PATENT DOCUMENTS

| | | |
|---|---|---|
| 10,580,846 B2 | 3/2020 | Seo et al. |
| 2006/0158560 A1 | 7/2006 | Jung |
| 2007/0091059 A1 | 4/2007 | Kang |
| 2015/0161928 A1 | 6/2015 | Kim et al. |
| 2015/0243203 A1* | 8/2015 | Kim .................. G09G 3/3291 345/212 |
| 2017/0148374 A1* | 5/2017 | Lee ..................... G09G 5/14 |
| 2017/0352328 A1 | 12/2017 | Jeong et al. |
| 2018/0247994 A1 | 8/2018 | Seo et al. |
| 2019/0147792 A1* | 5/2019 | Kim ..................... G09G 5/14 345/694 |
| 2020/0083473 A1* | 3/2020 | Gu .................. H01L 27/3244 |
| 2020/0176547 A1 | 6/2020 | Seo et al. |
| 2020/0203450 A1* | 6/2020 | Lou ................ H01L 27/3246 |

FOREIGN PATENT DOCUMENTS

| | | |
|---|---|---|
| CN | 101957509 | 1/2011 |
| CN | 105554423 | 5/2016 |
| CN | 105659620 | 6/2016 |
| CN | 108511487 | 9/2018 |
| TW | 201801061 | 1/2018 |

* cited by examiner

DISPLAY PANEL

CROSS-REFERENCE TO RELATED APPLICATION

This application claims the priority benefit of Taiwan application serial no. 107145079, filed on Dec. 13, 2018. The entirety of the above-mentioned patent application is hereby incorporated by reference herein and made a part of this specification.

BACKGROUND

Technical Field

The disclosure relates to a display panel, and more particularly to a display panel having a plurality of display areas.

Description of Related Art

The display panel is widely used in daily life due to advantages such as thinness, small size, and power saving. A plurality of display areas of the display panel may be used to display different contents at the same time. For example, advertisement and weather of the day may be displayed on the plurality of display areas of the display panel at the same time, wherein the advertisement needs to be frequently replaced while the weather of the day does not need to be frequently replaced. However, for conventional display panels, the display contents of all display areas are updated regardless at the same time regardless of whether the display content of each of the display areas needs to be frequently replaced, thereby resulting in power consumption problem.

SUMMARY

The disclosure provides a display panel with good performance.

The display panel of the disclosure includes a plurality of first pixel structures, a plurality of second pixel structures, a plurality of first signal lines, a plurality of second signal lines, a first driving circuit, and a second driving circuit. The plurality of first pixel structures is disposed in a first display area. The plurality of second pixel structures is disposed in a second display area. The second display area is located outside the first display area. The first display area and the second display area are arranged in a first direction. The plurality of first signal lines is disposed in the first display area and electrically connected to the first pixel structures. The first signal lines are arranged in a second direction. The first direction and the second direction are perpendicular. The plurality of second signal lines is disposed in the second display area and electrically connected to the second pixel structures. The second signal lines are arranged in the second direction. The first signal lines and the second signal lines are structurally separated. The first driving circuit is electrically connected to the first signal lines. The second driving circuit is electrically independent from the first driving circuit and electrically connected to the second signal lines.

Based on the above, the display panel according to an embodiment of the disclosure includes a plurality of first pixel structures, a plurality of second pixel structures, a plurality of first signal lines, a plurality of second signal lines, a first driving circuit, and a second driving circuit, wherein the first signal lines and the second signal lines are structurally separated, the first driving circuit is electrically connected to the first signal lines, the second driving circuit is electrically independent from the first driving circuit, and the second driving circuit is electrically connected to the second signal lines. As such, the first display area and the second display area are able to independently update display contents, thereby improving power consumption problem.

To make the aforementioned and other features of the disclosure more comprehensible, several embodiments accompanied with drawings are described in detail as follows.

DETAILED DESCRIPTION OF DISCLOSED EMBODIMENTS

The disclosure will be described more comprehensively hereinafter with reference to the accompanying drawings, in which exemplary embodiments of the disclosure are shown. It will be apparent to persons skilled in the art that various modifications can be made to the disclosed embodiments without departing from the scope or spirit of the disclosure.

In the drawings, the thickness of layers, films, panels, regions, etc., is magnified for clarity. Throughout the specification, the same reference numerals denote the same elements. It should be understood that when an element, such as a layer, film, region, or substrate, is referred to as being "on" or "connected to" another element, the former may be directly on or connected to the other element, or there may also be an intermediate element. In contrast, when an element is referred to as "directly on" or "directly connected to" another element, there is no intermediate element. As used herein, "connection" may refer to a physical and/or electrical connection. Furthermore, for "electrically connection" or "coupling", there may be another element between two elements.

In addition, relative terms such as "below" or "bottom" and "above" or "top" may be used herein to describe the relationship between one element and another element, as shown in the drawings. It should be understood that the relative terms are intended to encompass different orientations of the device in addition to the orientation shown. For example, if a device in an accompanying drawing is turned over, the element described as "below" the other elements will be directed as "above" the other elements. Therefore, the exemplary term "below" can include the orientations of "below" and "above" depending on the specific orientation of the accompanying drawing. Similarly, if a device in an accompanying drawing is turned over, the element described as "below" the other elements or the "bottom" element will be directed as "above" the other elements. Therefore, the exemplary term "on" or "under" can include the orientations of above and below.

As used herein, "about", "approximately", or "substantially" includes the stated value and the average value within the accepted deviation range of the particular value determined by persons with ordinary skill in the art in view of the discussed measurement and the specific amount of error (i.e. the limitation of the measuring system) associated with the measurement. For example, "about" may represent within one or more standard deviations of the stated value, or within ±30%, ±20%, ±10%, or ±5%. Furthermore, "about", "approximately" or "substantially" as used herein may select a relatively acceptable deviation range or standard deviation according to the optical property, the etching property, or other properties, and it is not necessary to apply one standard deviation to all properties.

Exemplary embodiments are described herein with reference to cross-sectional schematic drawings of an idealized embodiment. Therefore, shape variations of the drawings as a result of, for example, manufacturing technique and/or tolerance can be expected. Thus, the embodiments described herein should not be construed as being limited to the particular shapes of the regions as shown, but should include shape variations caused by, for example, manufacturing. For example, a region shown or described as flat may normally have a rough and/or non-linear feature. Furthermore, an acute angle shown may be round. Therefore, the regions shown in the drawings are essentially illustrative and the shapes thereof are not the exact shapes. The scope of the claims is not limited thereto.

Unless otherwise defined, all technical terms (including technical and scientific terms) used herein have the same meaning as commonly understood by persons with ordinary skill in the art. It should be further understood that the technical terms such as those defined in commonly used dictionaries shall be interpreted as having meanings consistent with their meanings in the relevant art and the context of the disclosure, and shall not be interpreted as having idealized or overly formal meanings, unless explicitly defined in the disclosure.

References shall now be made in detail to the exemplary embodiments of the disclosure. Wherever possible, the same reference numeral is used to represent the same or similar parts in the drawings and the descriptions.

Figure 1A:
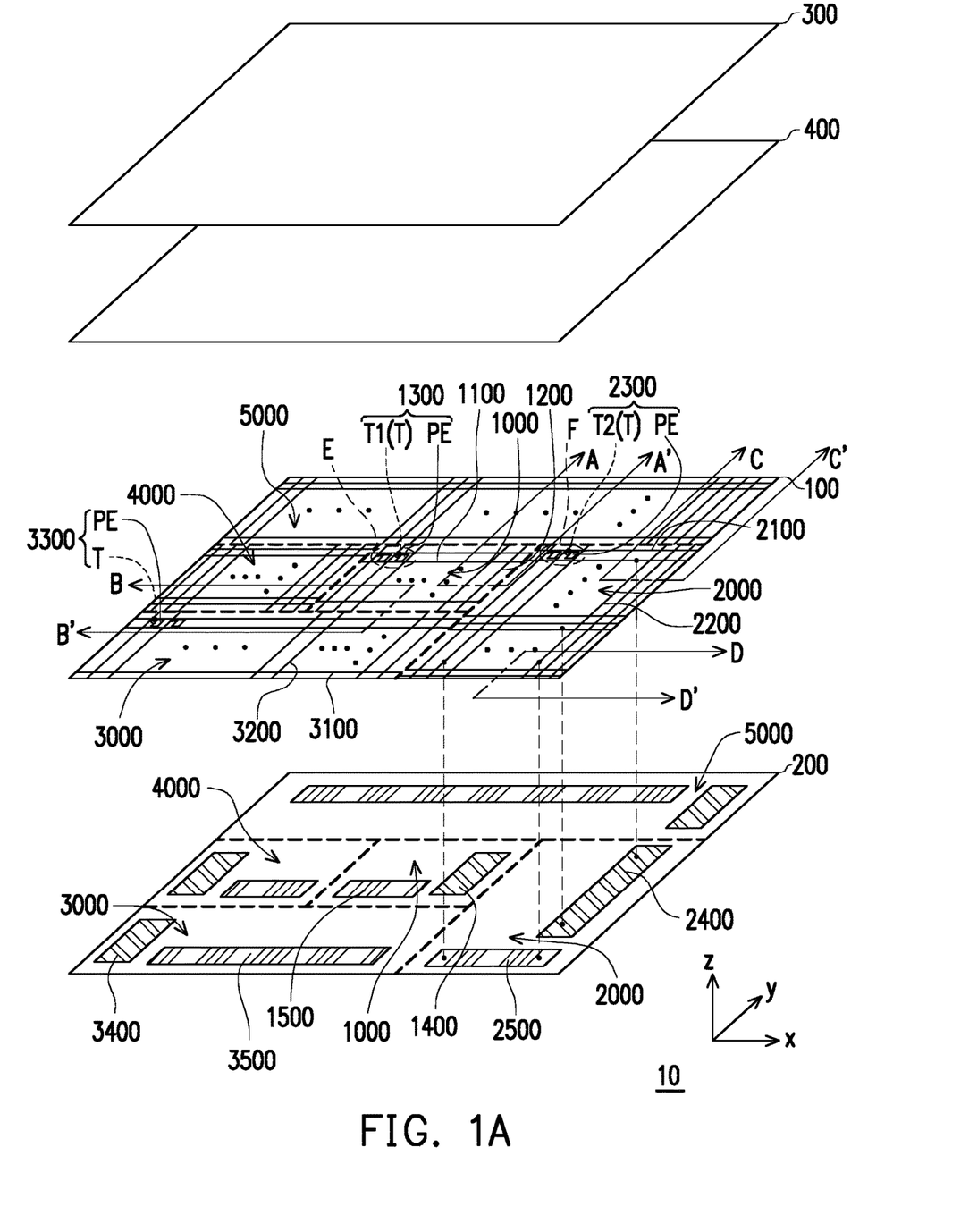
FIG. 1A is an exploded schematic view of a display panel according to an embodiment of the disclosure.
Figure 1B:
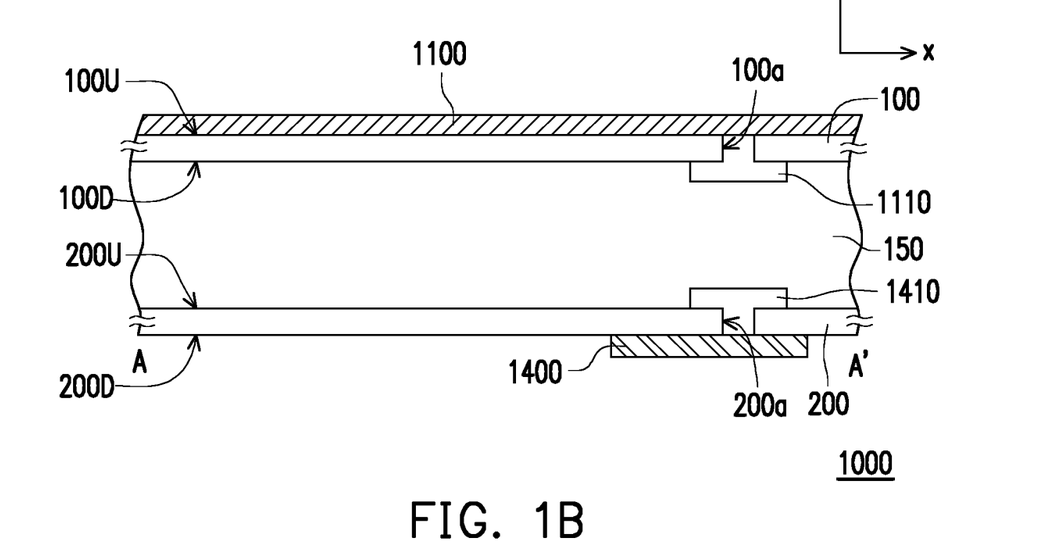
FIG. 1B is a cross-sectional schematic view of a first display area of the display panel corresponding to a sectional line A-A' of FIG. 1A.
Figure 1C:
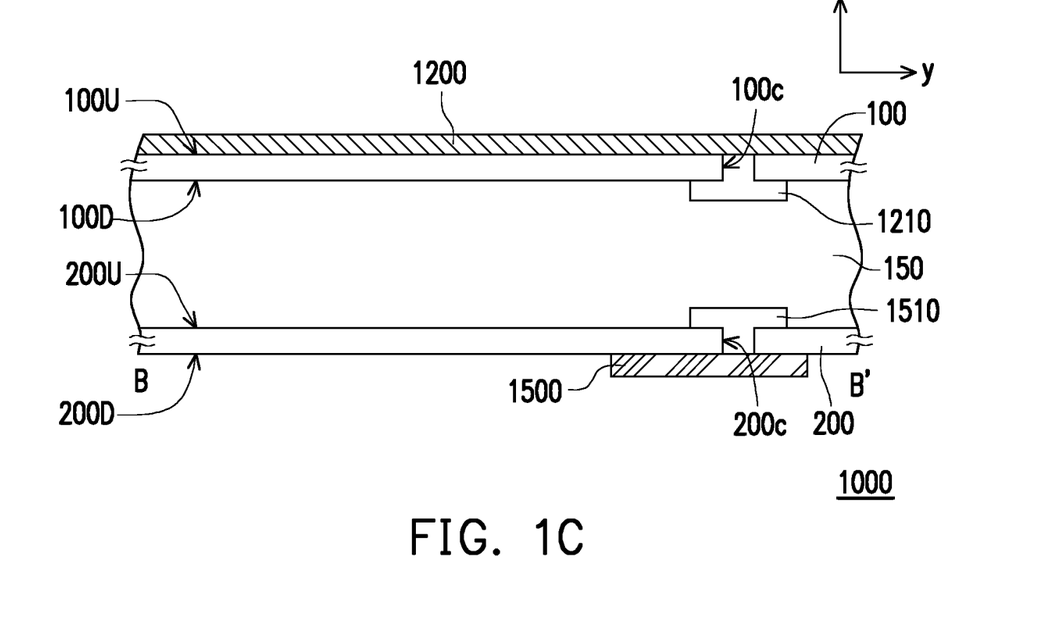
FIG. 1C is a cross-sectional schematic view of a first display area of the display panel corresponding to a sectional line B-B' of FIG. 1A.
Figure 1D:
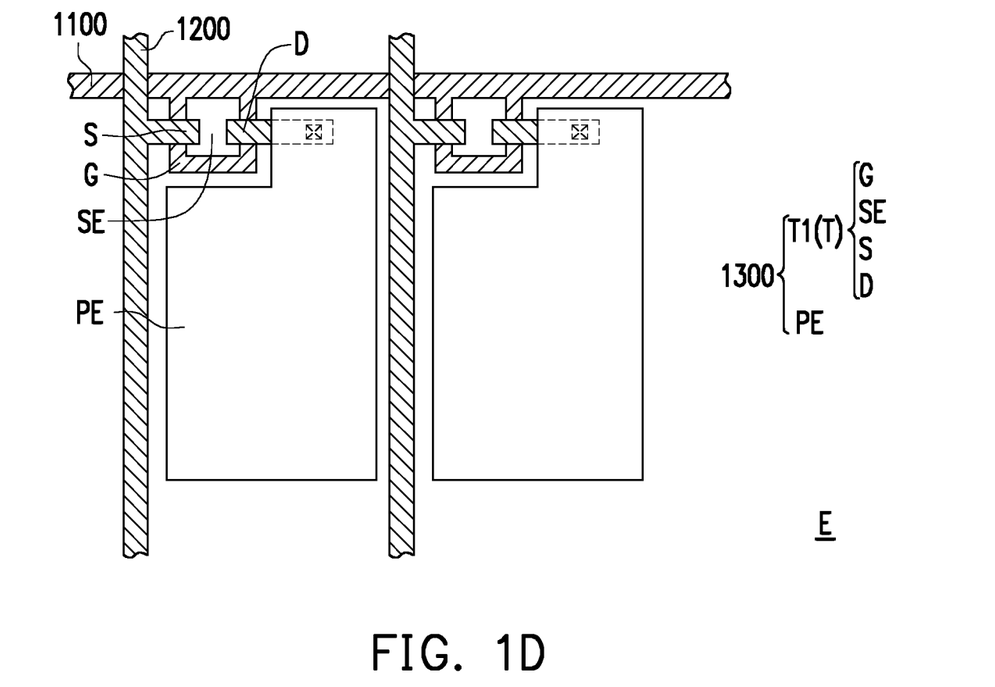
FIG. 1D is a top schematic view of a partial region E of the display panel of FIG. 1A.
Figure 1E:
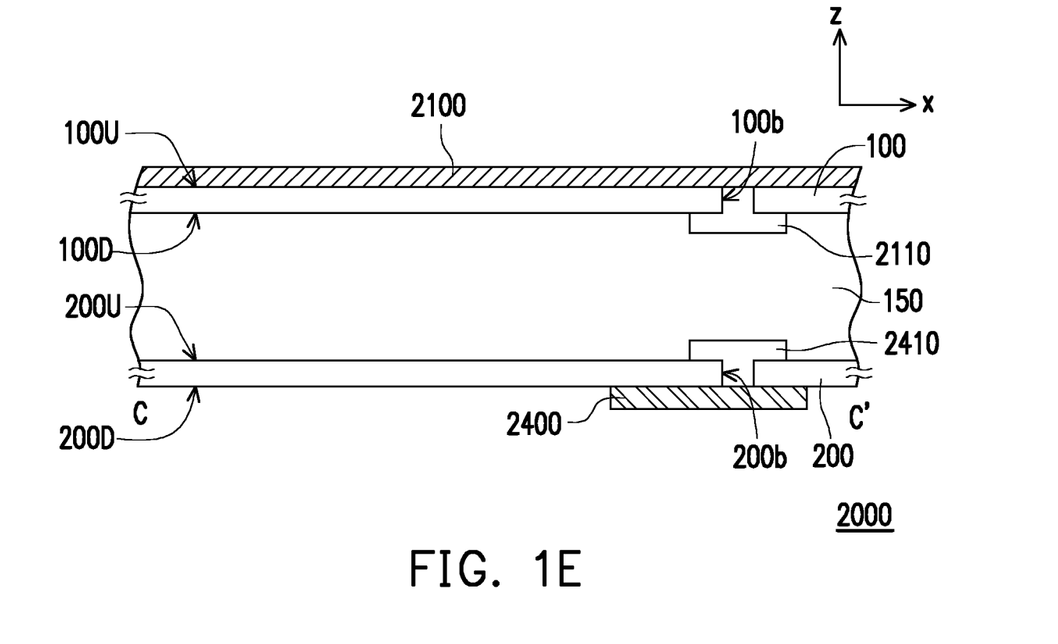
FIG. 1E is a cross-sectional schematic view of a second display area of the display panel corresponding to a sectional line C-C' of FIG. 1A.
Figure 1F:
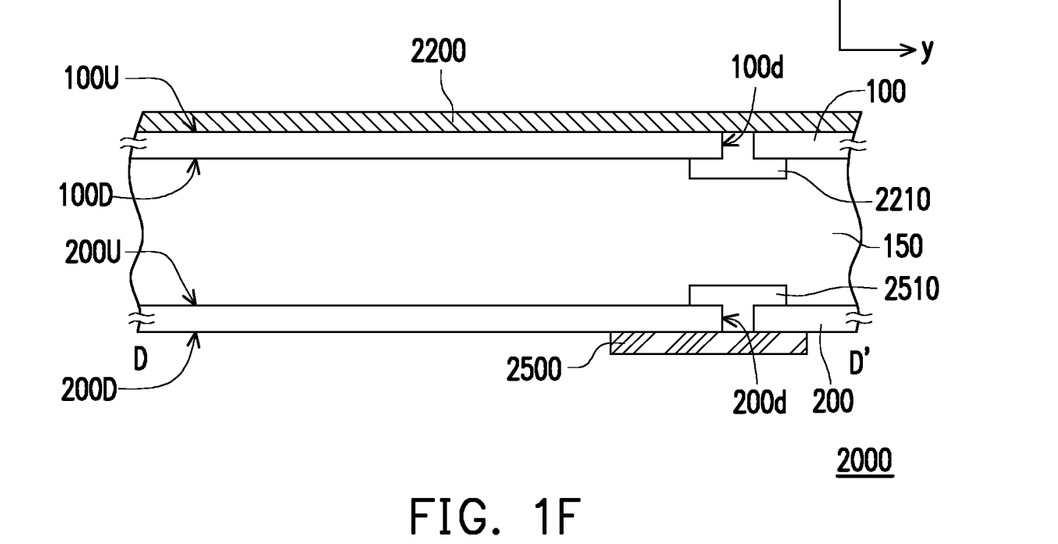
FIG. 1F is a cross-sectional schematic view of a second display area of the display panel corresponding to a sectional line D-D' of FIG. 1A.
Figure 1G:
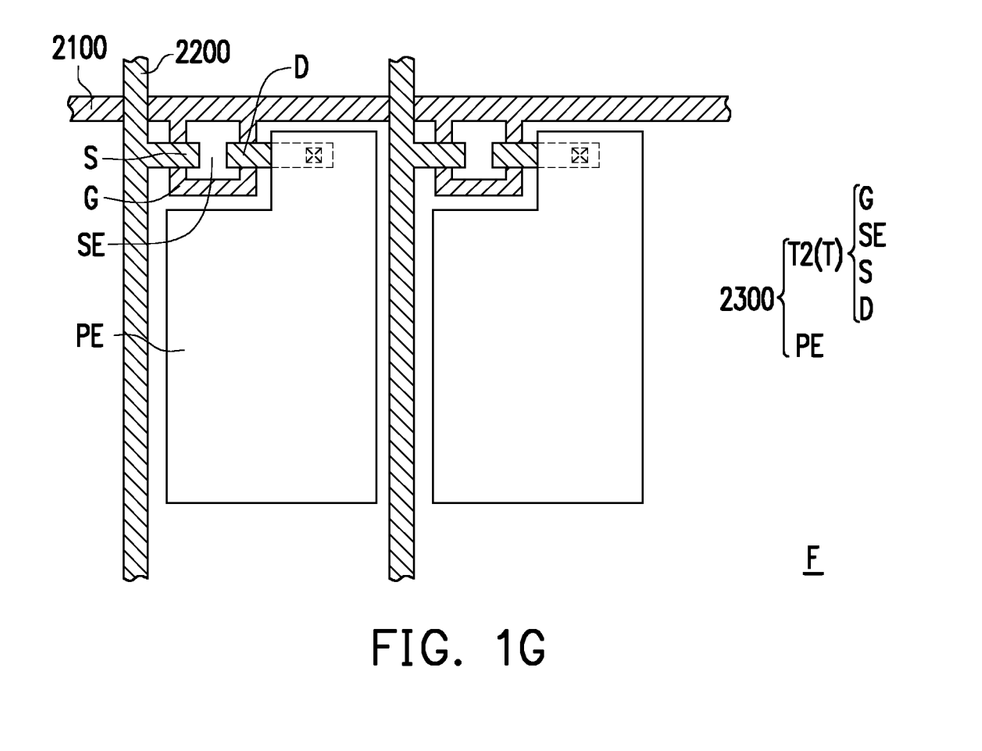
FIG. 1G is a top schematic view of a partial region F of the display panel of FIG. 1A.

FIG. 1A is an exploded schematic view of a display panel according to an embodiment of the disclosure. FIG. 1B is a cross-sectional schematic view of a first display area of the display panel corresponding to a sectional line A-A' of FIG. 1A. FIG. 1C is a cross-sectional schematic view of a first display area of the display panel corresponding to a sectional line B-B' of FIG. 1A. FIG. 1D is a top schematic view of a partial region E of the display panel of FIG. 1A. FIG. 1E is a cross-sectional schematic view of a second display area of the display panel corresponding to a sectional line C-C' of FIG. 1A. FIG. 1F is a cross-sectional schematic view of a second display area of the display panel corresponding to a sectional line D-D' of FIG. 1A. FIG. 1G is a top schematic view of a partial region F of the display panel of FIG. 1A.

FIG. 1B omits the illustration of first signal lines 1200, first pixel structures 1300, a first driving circuit 1500, second signal lines 2100, second signal lines 2200, second pixel structures 2300, a second driving circuit 2400, a second driving circuit 2500, a third substrate 300, and a display medium 400 of FIG. 1A. FIG. 1C omits the illustration of first signal lines 1100, the first pixel structures 1300, a first driving circuit 1400, the second signal lines 2100, the second signal lines 2200, the second pixel structures 2300, the second driving circuit 2400, the second driving circuit 2500, the third substrate 300, and the display medium 400 of FIG. 1A. FIG. 1E omits the illustration of the first signal lines 1100, the first signal lines 1200, the first pixel structures 1300, the first driving circuit 1400, the first driving circuit 1500, the second signal lines 2200, the second pixel structures 2300, the second driving circuit 2500, the third substrate 300, and the display medium 400 of FIG. 1A. FIG. 1F omits the illustration of the first signal lines 1100, the first signal lines 1200, the first pixel structures 1300, the first driving circuit 1400, the first driving circuit 1500, the second signal lines 2100, the second pixel structures 2300, the second driving circuit 2400, the third substrate 300, and the display medium 400 of FIG. 1A.

Referring to FIG. 1A, a display panel 10 has a first display area 1000 and a second display area 2000. The second display area 2000 is located outside the first display area 1000. The first display area 1000 and the second display area 2000 are arranged in a first direction x. In the embodiment, the shape of the first display area 1000 and the shape of the second display area 2000 may be selectively different. For example, in the embodiment, the first display area 1000 may be a rectangular region located in the middle of the display panel 10 and having a shorter length in a second direction y, and the second display area 200 may be another rectangular region located at the periphery of the display panel 10 and having a longer length in the second direction y. However, the disclosure is not limited thereto. According to other embodiments, the shape of the first display area 1000 and the shape of the second display area 2000 may also be the same.

In the embodiment, the display panel 10 may also have a third display area 3000 located outside the first display area 1000 and the second display area 2000. The first display area 1000 and the third display area 3000 are arranged in the second direction y. In the embodiment, the shape of the third display area 3000 and the shape of the first display area 1000 may be selectively different. For example, in the embodiment, the third display area 3000 may be a rectangular region located at the periphery of the display panel 10 and having a longer length in the first direction x. However, the disclosure is not limited thereto. According to other embodiments, the shape of the third display area 3000 and the shape of the first display area 1000 may also be the same.

It should be noted that three display areas (i.e. the first display area 1000, the second display area 2000, and the third display area 3000) are labeled FIG. 1A as an example. However, the disclosure is not limited thereto. According to other embodiments, the display panel 10 may also have two display areas or four or more display areas. In short, the display panel 10 may have a plurality of display areas and the number of the plurality of display areas may be determined according to actual requirements.

Referring to FIG. 1A to FIG. 1G, the display panel 10 includes a first substrate 100 having an upper surface 100U and a lower surface 100D opposite to each other. The first substrate 100 is used to carry the components thereon. In the embodiment, the first substrate 100 is, for example, a rigid substrate. However, the disclosure is not limited thereto. In other embodiments, the first substrate 100 may also be a flexible substrate. For example, the material of the rigid substrate may be glass, quartz, or other suitable materials and the material of the flexible substrate may be plastic or other suitable materials.

The display panel 10 further includes a plurality of pixel structures 1300, 2300, and 3300 disposed on the first substrate 100. Specifically, the plurality of pixel structures 1300, 2300, and 3300 are disposed on the upper surface 100U of the first substrate 100. Each of the plurality of pixel structures 1300, 2300, and 3300 includes a transistor T and a pixel electrode PE. The transistor T has a gate G, a semiconductor pattern SE, a source S, and a drain D, wherein the pixel electrode PE is electrically connected to the drain D of the transistor T.

The display panel 10 also includes a plurality of signal lines 1100, 1200, 2100, 2200, 3100, and 3200 disposed on the first substrate 100. Specifically, the plurality of signal lines 1100, 1200, 2100, 2200, 3100, and 3200 are disposed on the upper surface 100U of the first substrate 100. The plurality of signal lines 1200, 2200, and 3200 are arranged in the first direction x, and the plurality of signal lines 1100, 2100, and 3100 are arranged in the second direction y, wherein the first direction x and the second direction y are interlaced. For example, the first direction x and the second direction y may be perpendicular, but the disclosure is not limited thereto.

In the embodiment, the plurality of signal lines 1100, 2100, and 3100 are electrically connected to the plurality of gates G of the plurality of transistors T of the plurality of pixel structures 1300, 2300, and 3300. In other words, the plurality of signal lines 1100, 2100, and 3100 may be scan lines. In the embodiment, the plurality of signal lines 1200, 2200, and 3200 are electrically connected to the plurality of sources S of the plurality of transistors T of the plurality of pixel structures 1300, 2300, and 3300. In other words, the plurality of signal lines 1200, 2200, and 3200 may be data lines.

In the embodiment, the pluralities of pixel structures 1300, 2300, and 3300 of the display panel 10, including the first pixel structures 1300, the second pixel structures 2300, and the third pixel structures 3300, are respectively disposed in the first display area 1000, the second display area 2000, and the third display area 3000. The plurality of signal lines 1100, 1200, 2100, 2200, 3100, and 3200 includes the first signal lines 1100 and 1200, the second signal lines 2100 and 2200, and the third signal lines 3100 and 3200, electrically connected to the first pixel structures 1300, the second pixel structures 2300, and the third pixel structures 3300 respectively.

Referring to FIG. 1A, the plurality of first signal lines 1100 is arranged in the second direction y and disposed in the first display area 1000, and the plurality of second signal lines 2100 is arranged in the second direction y and disposed in the second display area 2000, wherein the first display area 1000 and the second display area 2000 are arranged in the first direction x. It should be noted that the plurality of first signal lines 1100 and the plurality of second signal lines 2100 are structurally separated, and driving signals may be independently inputted into the plurality of first signal lines 1100 and the plurality of second signal lines 2100.

Referring to FIG. 1A, the plurality of first signal lines 1200 is arranged in the first direction x and disposed in the first display area 1000, and the plurality of third signal lines 3200 is arranged in the first direction x and disposed in the third display area 3000, wherein the first display area 1000 and the third display area 3000 are arranged in the second direction y. It should be noted that in the embodiment, the first signal lines 1200 and the third signal lines 3200 may be selectively separated in structure, and the first signal lines 1200 and the third signal lines 3200 may be selectively inputted independently. However, the disclosure is not limited thereto.

Referring to FIG. 1A, the display panel 10 further includes a second substrate 200 disposed below the first substrate 100. Specifically, the first substrate 100 has an upper surface 100U facing away from the second substrate 200 and a lower surface 100D facing the second substrate. The second substrate 200 has an upper surface 200U facing the first substrate 100 and a lower surface 200D facing away from the first substrate 100. In the embodiment, the second substrate 200 is, for example, a rigid substrate. However, the disclosure is not limited thereto. In other embodiments, the second substrate 200 may also be a flexible substrate. For example, the material of the rigid substrate may be glass, quartz, or other suitable materials and the material of the flexible substrate may be plastic or other suitable materials.

Referring to FIG. 1A to FIG. 1C, FIG. 1E, and FIG. 1F, the display panel 10 further includes a plurality of driving circuits 1400, 1500, 2400, 2500, 3400, and 3500 disposed on the second substrate 200. For example, in the embodiment, the plurality of driving circuits 1400, 1500, 2400, 2500, 3400, and 3500 may be selectively disposed on the lower surface 200D of the second substrate 200, but the disclosure is not limited thereto.

Referring to FIG. 1B, the first driving circuit 1400 is electrically connected to the plurality of first signal lines 1100. In the embodiment, the plurality of first signal lines 1100 is scan lines and the first driving circuit 1400 is a gate driving circuit. For example, in the embodiment, the first substrate 100 has a plurality of first vias 100a disposed in the first display area 1000 and each of the plurality of first vias 100a extends from the upper surface 100U of the first substrate 100 to the lower surface 100D of the first substrate 100; and a plurality of first signal line junctions 1110 disposed in the plurality of first vias 100a of the first substrate 100 and electrically connected to the plurality of first signal lines 1100 respectively. The second substrate 200 has a plurality of third vias 200a respectively disposed in the first display area 1000 and each of the plurality of third vias 200a extends from the upper surface 200U of the second substrate 200 to the lower surface 200D of the second substrate 200; and a plurality of first driving circuit junctions 1410 disposed in the plurality of third vias 200a of the second substrate 200 and electrically connected to the first driving circuit 1400. In the embodiment, the plurality of first signal line junctions 1110 may be electrically connected to the plurality of first driving circuit junctions 1410 respectively and correspondingly, allowing the first driving circuit 1400 disposed on the second substrate 200 to be electrically connected to the plurality of first signal lines 1100 disposed on the first substrate 100.

Referring to FIG. 1C, the first driving circuit 1500 is electrically connected to the plurality of first signal lines 1200. In the embodiment, the plurality of first signal lines 1200 is data lines and the first driving circuit 1500 is a source driving circuit. For example, in the embodiment, the first substrate 100 has a plurality of first vias 100c disposed in the first display area 1000 and each of the plurality of first vias 100c extends from the upper surface 100U of the first substrate 100 to the lower surface 100D of the first substrate 100; and a plurality of first signal line junctions 1210 disposed in the plurality of first vias 100c of the first substrate 100 and electrically connected to the plurality of first signal lines 1200 respectively. The second substrate 200 has a plurality of third vias 200c disposed in the first display area 1000 and each of the plurality of third vias 200c extends from the upper surface 200U of the second substrate 200 to the lower surface 200D of the second substrate 200; and a plurality of first driving circuit junctions 1510 disposed in the plurality of third vias 200c of the second substrate 200 and electrically connected to the first driving circuit 1500. In the embodiment, the plurality of first signal line junctions 1210 may be electrically connected to the plurality of first driving circuit junctions 1510 respectively and correspondingly, allowing the first driving circuit 1500 disposed on the second substrate 200 to be electrically connected to the plurality of first signal lines 1200 of the first substrate 100.

Referring to FIG. 1E, the second driving circuit 2400 is electrically connected to the plurality of second signal lines 2100. In the embodiment, the plurality of first signal lines 2100 is scan lines and the second driving circuit 2400 is a gate driving circuit. For example, in the embodiment, the first substrate 100 has a plurality of second vias 100b disposed in the second display area 2000 and each of the plurality of second vias 100b extends from the upper surface 100U of the first substrate 100 to the lower surface 100D of the first substrate 100; and a plurality of second signal line junctions 2110 disposed in the plurality of second vias 100b of the first substrate 100 and electrically connected to the plurality of second signal lines 2100 respectively. The second substrate 200 has a plurality of fourth vias 200b respectively disposed in the second display area 2000 and each of the plurality of fourth vias 200b extends from the upper surface 200U of the second substrate 200 to the lower surface 200D of the second substrate 200; and a plurality of second driving circuit junctions 2410 disposed on the plurality of fourth vias 200b of the second substrate 200 and electrically connected to the second driving circuit 2400. In the embodiment, the plurality of second signal line junctions 2110 may be electrically connected to the plurality of second driving circuit junctions 2410 respectively and correspondingly, allowing the second driving circuit 2400 disposed on the second substrate 200 to be electrically connected to the plurality of second signal lines 2100 of the first substrate 100.

Referring to FIG. 1F, the second driving circuit 2500 is electrically connected to the plurality of second signal lines 2200. In the embodiment, the plurality of second signal lines 2200 is data lines and the second driving circuit 2500 is a source driving circuit. For example, in the embodiment, the first substrate 100 has a plurality of second vias 100d disposed in the second display area 2000 and each of the plurality of second vias 100d extends from the upper surface 100U of the first substrate 100 to the lower surface 100D of the first substrate 100; and a plurality of second signal line junctions 2210 disposed in the plurality of second vias 100d of the first substrate 100 and electrically connected to the plurality of second signal lines 2200 respectively. The second substrate 200 has a plurality of fourth vias 200d respectively disposed in the second display area 2000 and each of the plurality of fourth vias 200d extends from the upper surface 200U of the second substrate 200 to the lower surface 200D of the second substrate 200; and a plurality of second driving circuit junctions 2510 disposed on the plurality of fourth vias 200d of the second substrate 200 and electrically connected to the second driving circuit 2500. In the embodiment, the plurality of second signal line junctions 2510 may be electrically connected to the plurality of second driving circuit junctions 2210 respectively and correspondingly, allowing the second driving circuit 2500 disposed on the second substrate 200 to be electrically connected to the plurality of second signal lines 2200 of the first substrate 100.

Similarly, the third driving circuit 3400 may also be electrically connected to the plurality of third signal lines 3100 using a similar manner and the third driving circuit 3500 may also be electrically connected to the plurality of third signal lines 3200 using a similar manner, but the disclosure is not limited thereto.

In the embodiment, the display panel 10 may further include an adhesive 150 disposed between the lower surface 100D of the first substrate 100 and the upper surface 200U of the second substrate 200. The first substrate 100 and the second substrate 200 may be selectively fixed to each other using the adhesive 150, but the disclosure is not limited thereto. For example, in the embodiment, the adhesive 150 may be an anisotropic conductive adhesive. Also, the plurality of first signal line junctions 1110 and the plurality of first driving circuit junctions 1410 (the plurality of first signal line junctions 1210 and the plurality of first driving circuit junctions 1510, the plurality of second signal line junctions 2110 and the plurality of second driving circuit junctions 2410, and/or the plurality of second signal line junctions 2210 and the plurality of second driving circuit junctions 2510) may be electrically connected to each other selectively through the anisotropic conductive adhesive, but the disclosure is not limited thereto. According to other embodiments, the plurality of first signal line junctions 1110 and the plurality of first driving circuit junctions 1410 (the plurality of first signal line junctions 1210 and the plurality of first driving circuit junctions 1510, the plurality of second signal line junctions 2110 and the plurality of second driving circuit junctions 2410, and/or the plurality of second signal line junctions 2210 and the plurality of second driving circuit junctions 2510) may also be electrically connected to each other by other suitable means.

It is worth mentioning that since the first signal lines 1100 and the second signal lines 2100 are structurally separated and electrically connected to the first driving circuit 1400 and the second driving circuit 2400, which are electrically independent from each other respectively, the display panel 10 may respectively set the frame rate (also known as the update rate) of the first display area 1000 and the frame rate of the second display area 2000 according to the content of the entire display screen, thereby reducing power consumption of the display panel 10. For example, in the embodiment, the first display area 1000 may be used to display a screen (for example, an advertisement) which needs to be frequently replaced and the second display area 2000 may be used to display a screen (for example, the weather of the day) which does not need to be frequently replaced. At this time, the frame rate of the second display area 2000 may be set to be smaller than the frame rate of the first display area 1000 (in other words, the frame rate of the first display area 1000 is larger than the frame rate of the second display area 2000). As such, the display panel 10 with a low power consumption can be realized.

In the embodiment, the type of the transistor T provided in each of the display areas may be selected according to whether the screen of each of the display areas needs to be frequently replaced. For example, in the embodiment, the first display area 1000 is configured to display a screen which needs to be frequently replaced and the second display area 2000 is configured to display a screen which does not need to be frequently replaced. As such, the carrier mobility of the semiconductor pattern SE of a first transistor T1 provided in the first display area 1000 may be set differently from the carrier mobility of the semiconductor pattern SE of a second transistor T2 provided in the second display area 2000. Specifically, the first display area 1000 is configured to display a screen which needs to be frequently replaced and the second display area 2000 is configured to display a screen which does not need to be frequently replaced. As such, the carrier mobility of the semiconductor pattern SE of the first transistor T1 provided in the first display area 1000 is set to be larger than the carrier mobility of the semiconductor pattern SE of the second transistor T2 provided in the second display area 2000. In other words, the first transistor T1 provided in the display area (for example, the first display area 1000) with a screen which needs to be frequently replaced may have a stronger charging capacity, thereby optimizing the performance of the display panel 10.

For example, in the embodiment, the first display area 1000 is configured to display a screen which needs to be frequently replaced, the second display area 2000 is configured to display a screen which does not need to be frequently replaced, and an off-current value Ioff of the first transistor T1 provided in the first display area 1000 may be different from an off-current value Ioff of the second transistor T2 provided in the second display area 2000. Specifically, the first display area 1000 is configured to display a screen which needs to be frequently replaced, the second display area 2000 is configured to display a screen which does not need to be replaced frequently, and the off-current value Ioff of the second transistor T2 provided in the second display area 2000 may be lower than the off-current value Ioff of the first transistor T1 provided in the display area 1000. In other words, the second transistor T2 disposed in the display area (for example, the second display area 2000) with a screen which does not need to be frequently replaced is less likely to leak, thereby optimizing the performance of the display panel 10.

Specifically, in the embodiment, the material of the semiconductor pattern SE of the first transistor T1 is different from the material of the semiconductor pattern SE of the first transistor T2. For example, the material of the semiconductor transistor SE of the first transistor T1 may be low temperature poly-silicon (LIPS) with a high carrier mobility and the material of the semiconductor pattern SE of the second transistor T2 may be metal oxide with a low carrier mobility. The off-current value Ioff of the second transistor T2, with the material of the semiconductor transistor SE material being metal oxide, is lower than the off-current value Ioff of the first transistor T1, with the material of the semiconductor pattern SE being LIPS. In addition, for example, in the embodiment, the screens of both the third display area 3000 and the second display area 2000 do not need to be frequently replaced, and the material of the semiconductor pattern of the third transistor provided in the third display area 3000 and the material of the semiconductor pattern of the third transistor provided in the second display area 2000 are both metal oxide; the screens of both the fourth display area 4000 and the first display area 1000 need to be frequently replaced, the material of the semiconductor pattern of the fourth transistor provided in the fourth display area 4000 and the material of the semiconductor pattern of the first transistor provided in the first display area 1000 are both LIPS; the area of the fifth display area 5000 is large and the material of the semiconductor pattern of the fifth transistor provided in the fifth display area 5000 is amorphous silicon with a lower manufacturing cost. However, the disclosure is not limited thereto. According to other embodiments, the material of the semiconductor pattern of the transistor provided in each of the display areas may also be other suitable materials.

In addition, it is worth mentioning that in the embodiment, the pixel density (with unit being, for example, ppi) of the first display area 1000 is different from the pixel density of the second display area 2000. That is, the resolution of the first display area 1000 is different from the resolution of the second display area 2000. The plurality of first pixel structures 1300 and the plurality of second pixel structures 2300, electrically connected to the plurality of first signal lines 1200 and the plurality of second signal lines 2200 respectively, and having different densities, may be respectively driven by the driving circuit 1500 and the driving circuit 2500. Similarly, the pixel density (with unit being, for example, ppi) of the first display area 1000 may be selectively different from the pixel density of the third display area 3000. That is, the resolution of the first display area 1000 may be different from the resolution of the third display area 3000. In the embodiment, the first signal lines 1200 and the third signal lines 3200, structurally separated. The plurality of first pixel structures 1300 and the plurality of third pixel structures 3300, electrically connected to the plurality of first signal lines 1200 and the plurality of third signal lines 3200 respectively, and having different densities, may be respectively driven by the driving circuit 1500 and the driving circuit 3500, but the disclosure is not limited thereto.

Referring to FIG. 1A, in the embodiment, the display panel 10 may further include a third substrate 300 and a display medium 400. The third substrate 300 is disposed above the first substrate 100 and the display medium 400 is disposed between the first substrate 100 and the third substrate 300. The third substrate 300 is disposed on top of the upper surface 100U of the first substrate 100. The second substrate 200, the first substrate 100, the display medium 400, and the third substrate 300 are arranged in a third direction z. The third direction z may be perpendicular to the first direction x and the second direction y. In the embodiment, the third substrate 300 is, for example, a rigid substrate. However, the disclosure is not limited thereto. In other embodiments, the third substrate 300 may also be a flexible substrate. For example, the material of the rigid substrate may be glass, quartz, or other suitable materials and the material of the flexible substrate may be plastic or other suitable materials. In the embodiment, the display medium 400 may include an organic electroluminescent layer, liquid crystal molecules, an electrophoretic display medium, or other applicable mediums, but the disclosure is not limited thereto.

Figure 2:
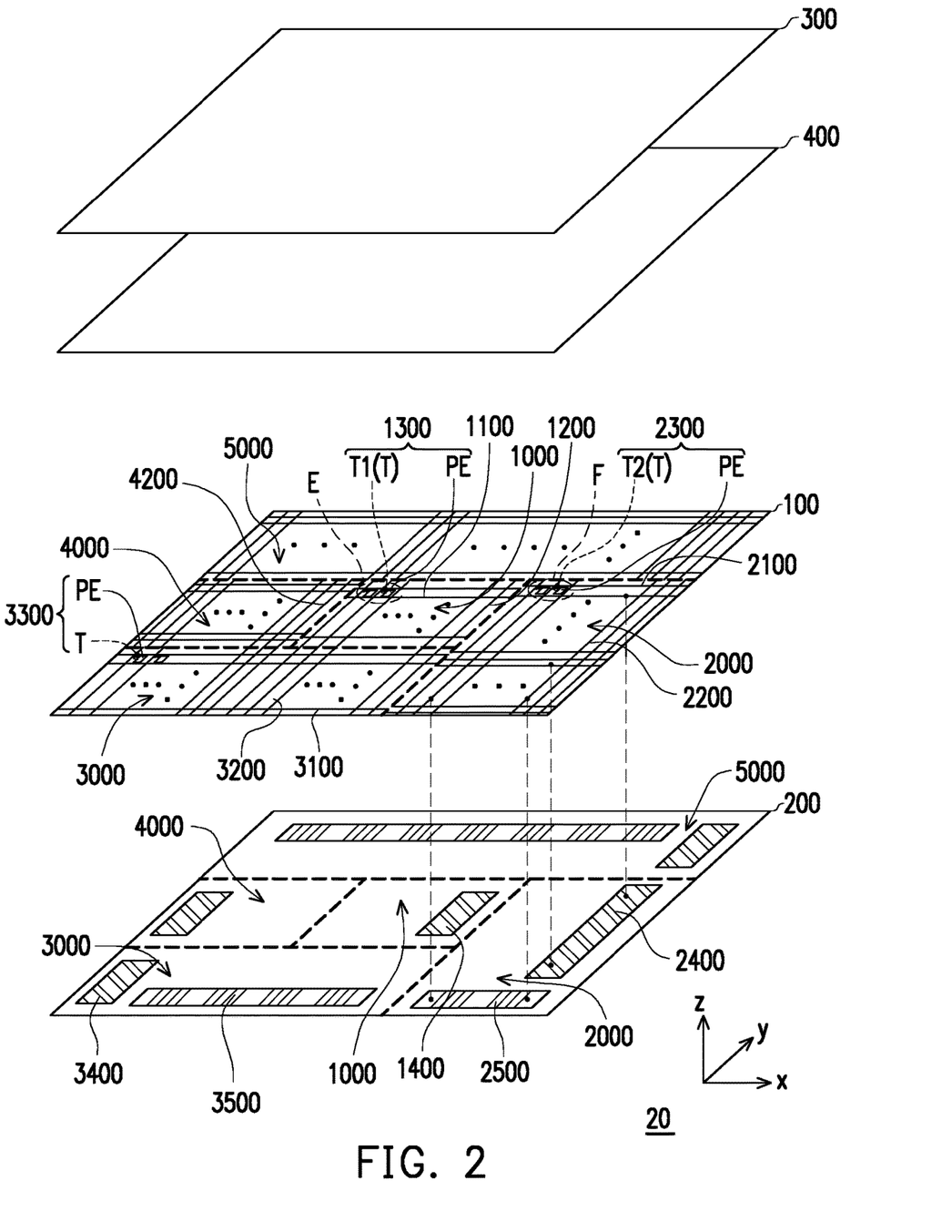
FIG. 2 is an exploded schematic view of a display panel according to another embodiment of the disclosure.

FIG. 2 is an exploded schematic view of a display panel according to another embodiment of the disclosure. It should be noted that the embodiment of FIG. 2 continues to use the reference numerals and some content of the embodiment of FIG. 1A, wherein the same or similar reference numerals are adopted to denote the same or similar elements and descriptions of the same technical content are omitted. For the descriptions of the omitted parts, references may be made to the foregoing embodiments and shall not be reiterated in the following embodiments.

The main difference between the embodiment of FIG. 2 and the embodiment of FIG. 1A is that the first signal lines 1200 of the first display area 1000 and the third signal lines 3200 of the third display area are connected to each other.

Referring to FIG. 2, in a display panel 20 of the embodiment, the first signal lines 1200 of the first display area 1000 and third signal lines 3200 of the third display area are connected to each other and electrically connected to the same third driving circuit 3500. That is, the first display area 1000 and the third display area 3000 share the same driving circuit. In the embodiment, a fourth display area 4000 and the third display area 3000 are arranged in a second direction y. Also, fourth signal lines 4200 disposed in the fourth display area 4000 and extended in a first direction x are connected to the third signal lines 3200. Furthermore, the fourth signal lines 4200 of the display area 4000 and the third signal lines 3200 are electrically connected to the same third driving circuit 3500. In other words, the first display area 1000, the third display area 3000, and the fourth display area 4000 of the embodiment share the same driving circuit.

Figure 3:
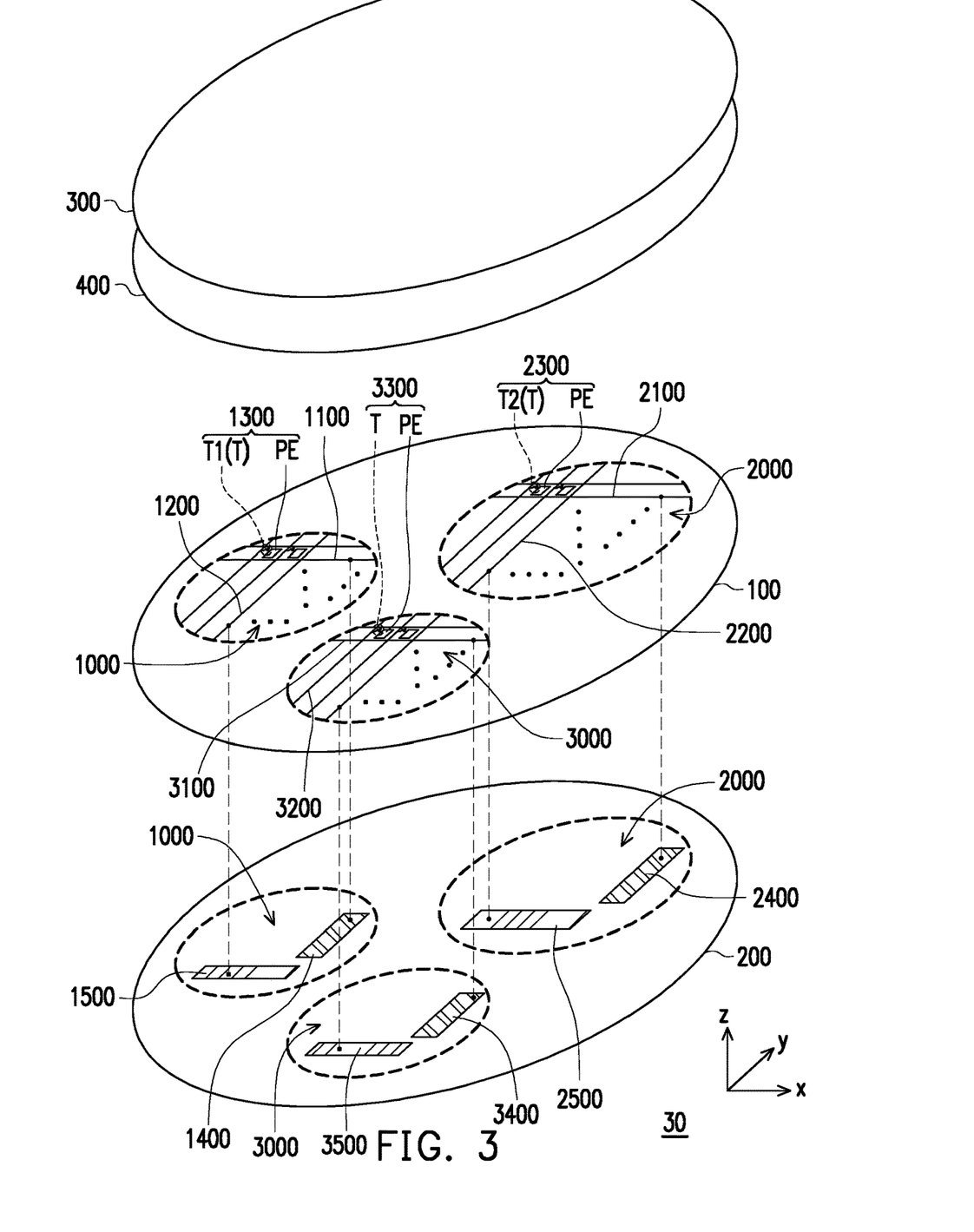
FIG. 3 is an exploded schematic view of a display panel according to yet another embodiment of the disclosure.

FIG. 3 is an exploded schematic view of a display panel according to yet another embodiment of the disclosure. It should be noted that the embodiment of FIG. 3 continues to use the reference numerals and some content of the embodiment of FIG. 1A, wherein the same or similar reference numerals are adopted to denote the same or similar elements and descriptions of the same technical content are omitted. For the descriptions of the omitted parts, references may be made to the foregoing embodiments and shall not be reiterated in the following embodiments.

The main difference between the embodiment of FIG. 3 and the embodiment of FIG. 1A is that the display panel 30 may be a free-form display panel. Furthermore, in the present embodiment, the shapes of the first display area 1000 and the second display area 2000 may not be rectangular.

Referring to FIG. 3, for example, in the display panel 30 of the embodiment, the shape of the first display area 1000 and/or the shape of the second display area 2000 are circular. However, the disclosure is not limited thereto. In other embodiments, the shape of the first display area 1000 and/or the shape of the second display area 2000 may also be elliptical, polygonal, or other suitable shapes.

Similarly, in the display panel 30 according to an embodiment of the disclosure, the first signal lines 1100 and the second signal lines 2100 are structurally separated, the first driving circuit 1400 is electrically connected to the first signal lines 1100, the second driving circuit 2400 is electrically independent from the first driving circuit 1400, and the second driving circuit 2400 is electrically connected to the second signal lines 2100. As such, the first display area 1000 and the second display area 2000 may independently update the display contents, thereby reducing power consumption of the display panel 30.

Figure 4:
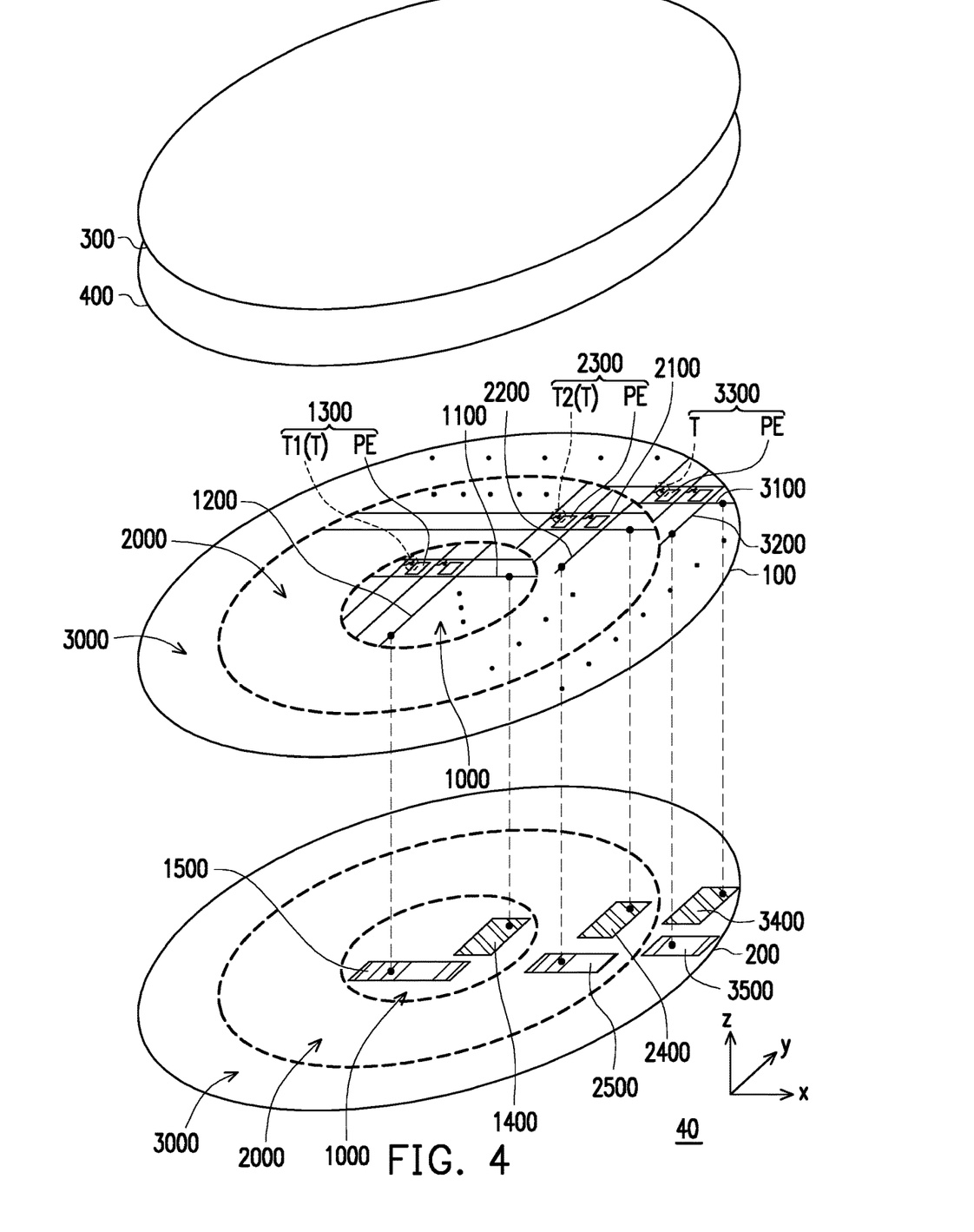
FIG. 4 is an exploded schematic view of a display panel according to still another embodiment of the disclosure.

FIG. 4 is an exploded schematic view of a display panel according to still another embodiment of the disclosure. It is to be noted that the embodiment of FIG. 4 continues to use the reference numerals and some content of the embodiment of FIG. 3, wherein the same or similar reference numerals are adopted to denote the same or similar elements and descriptions of the same technical content are omitted. For the descriptions of the omitted parts, references may be made to the foregoing embodiments and shall not be reiterated in the following embodiments.

The main difference between the embodiment of FIG. 4 and the embodiment of FIG. 3 is that the first display area 1000 and the second display area 2000 are arranged differently.

Referring to FIG. 4, in a display panel 40 of the embodiment, the first display area 1000 and the second display area 2000 are arranged in a concentric manner. For example, the shape of the first display area 1000 is a circle and the shape of the second display area 2000 is a ring-shape surrounding the first display area 1000, but the disclosure is not limited thereto.

Similarly, in the display panel 40 according to the embodiment of the disclosure, the first signal lines 1100 and the second signal lines 2100 are structurally separated, the first driving circuit 1400 is electrically connected to the first signal lines 1100, the second driving circuit 2400 is electrically independent from the first driving circuit 1400, and the second driving circuit 2400 is electrically connected to the second signal lines 2100. As such, the first display area 1000 and the second display area 2000 may independently update the display contents, thereby reducing power consumption of the display panel 30.

Based on the above, the display panel according to an embodiment of the disclosure includes a plurality of first pixel structures, a plurality of second pixel structures, a plurality of first signal lines, a plurality of second signal lines, a first driving circuit, and a second driving circuit, wherein the first signal lines and the second signal lines are structurally separated, the first driving circuit is electrically connected to the first signal lines, the second driving circuit is electrically independent from the first driving circuit, and the second driving circuit is electrically connected to the second signal lines. As such, the first display area and the second display area may independently update the display contents, thereby improving power consumption problem of the display panel.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
   a plurality of first pixel structures disposed in a first display area, wherein each of the plurality of first pixel structures comprises a first transistor, and the first transistor has a gate, a semiconductor pattern, a source and a drain;
   a plurality of second pixel structures disposed in a second display area, wherein each of the plurality of second pixel structures comprises a second transistor, and the second transistor has a gate, a semiconductor pattern, a source and a drain, the second display area is located outside the first display area, and the first display area and the second display area are arranged in a first direction;
   a plurality of first signal lines disposed in the first display area and electrically connected to gates of first transistors of the plurality of first pixel structures, wherein the plurality of first signal lines is arranged in a second direction and the first direction and the second direction are perpendicular;
   a plurality of second signal lines disposed in the second display area and electrically connected to gates of second transistors of the plurality of second pixel structures, wherein the plurality of second signal lines is arranged in the second direction and the plurality of first signal lines and the plurality of second signal lines are structurally separated;
   a first driving circuit electrically connected to the plurality of first signal lines;
   a second driving circuit electrically independent from the first driving circuit and electrically connected to the plurality of second signal lines;

a first substrate, wherein the plurality of first pixel structures and the plurality of second pixel structures are disposed on the first substrate; and a second substrate disposed below the first substrate, wherein the first driving circuit and the second driving circuit are disposed on the second substrate, the first substrate has an upper surface facing away from the second substrate and a lower surface facing the second substrate, the first substrate has a plurality of first vias and a plurality of second vias respectively disposed in the first display area and the second display area, each of the plurality of first vias and the plurality of second vias extends from the upper surface of the first substrate to the lower surface of the first substrate, the plurality of first pixel structures, the plurality of second pixel structures, the plurality of first signal lines, and the plurality of second signal lines are disposed on the upper surface of the first substrate;

a plurality of first signal line junctions disposed on the plurality of first vias of the first substrate and electrically connected to the plurality of first signal lines respectively, wherein the plurality of first signal line junctions is electrically connected to the first driving circuit; and a plurality of second signal line junctions disposed on the plurality of second vias of the first substrate and electrically connected to the plurality of second signal lines respectively, wherein the plurality of second signal line junctions is electrically connected to the second driving circuit.

2. The display panel according to claim 1, wherein the second substrate has an upper surface facing the first substrate and a lower surface facing away from the first substrate, the second substrate has a plurality of third vias and a plurality of fourth vias respectively disposed in the first display area and the second display area, each of the plurality of third vias and the plurality of fourth vias extends from the upper surface of the second substrate to the lower surface of the second substrate, and the first driving circuit and the second driving circuit are disposed on the lower surface of the second substrate, the display panel further comprising:

a plurality of first driving circuit junctions disposed on the plurality of third vias of the second substrate, electrically connected to the first driving circuit, and electrically connected to the plurality of first signal line junctions respectively; and a plurality of second driving circuit junctions disposed on the plurality of fourth vias of the second substrate, electrically connected to the second driving circuit, and electrically connected to the plurality of second signal line junctions respectively.

3. The display panel according to claim 1, wherein a frame rate of the first display area is different from a frame rate of the second display area.

4. The display panel according to claim 1, wherein a density of the plurality of first pixel structures is different from a density of the plurality of second pixel structures.

5. The display panel according to claim 1, wherein a material of a semiconductor pattern of the first transistor is different from a material of a semiconductor pattern of the second transistor.

6. The display panel according to claim 1, wherein a carrier mobility of a semiconductor pattern of the first transistor is different from a carrier mobility of a semiconductor pattern of the second transistor.

7. The display panel according to claim 6, wherein a frame rate of the first display area is larger than a frame rate of the second display area and the carrier mobility of the semiconductor pattern of the first transistor is larger than the carrier mobility of the semiconductor pattern of the second transistor.

8. The display panel according to claim 1, wherein an off-current value of the first transistor is different from an off-current value of the second transistor.

9. The display panel according to claim 8, wherein a frame rate of the second display area is smaller than a frame rate of the first display area and the off-current value of the second transistor is smaller than the off-current value of the first transistor.

* * * * *